United States Patent
Ooshima et al.

(10) Patent No.: US 9,640,481 B2
(45) Date of Patent: May 2, 2017

(54) SEMICONDUCTOR DEVICE AND METHOD OF MANUFACTURING THE SAME

(71) Applicant: KABUSHIKI KAISHA TOSHIBA, Minato-ku (JP)

(72) Inventors: Kazuhiro Ooshima, Kuwana (JP); Takanori Matsumoto, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/986,919

(22) Filed: Jan. 4, 2016

(65) Prior Publication Data
US 2017/0069571 A1    Mar. 9, 2017

Related U.S. Application Data

(60) Provisional application No. 62/213,821, filed on Sep. 3, 2015.

(51) Int. Cl.
| | |
|---|---|
| *H01L 23/528* | (2006.01) |
| *H01L 21/768* | (2006.01) |
| *H01L 23/522* | (2006.01) |
| *H01L 23/532* | (2006.01) |

(52) U.S. Cl.
CPC .... *H01L 23/5283* (2013.01); *H01L 21/76816* (2013.01); *H01L 21/76831* (2013.01); *H01L 21/76877* (2013.01); *H01L 21/76888* (2013.01); *H01L 23/5226* (2013.01); *H01L 23/53223* (2013.01); *H01L 23/53238* (2013.01); *H01L 23/53266* (2013.01)

(58) Field of Classification Search
CPC ................. H01L 21/76888; H01L 23/5283
See application file for complete search history.

(56) References Cited

U.S. PATENT DOCUMENTS

| | | | |
|---|---|---|---|
| 7,910,288 B2 | 3/2011 | Abatchev et al. | |
| 8,901,016 B2 | 12/2014 | Ha et al. | |
| 9,437,443 B2 * | 9/2016 | Brink ................. | H01L 21/3088 |

FOREIGN PATENT DOCUMENTS

| | | |
|---|---|---|
| JP | 4822077 | 11/2011 |
| JP | 2012-142574 | 7/2012 |
| JP | 2014-170789 | 9/2014 |

* cited by examiner

*Primary Examiner* — Moazzam Hossain
*Assistant Examiner* — Farun Lu
(74) *Attorney, Agent, or Firm* — Oblon, McClelland, Maier & Neustadt, L.L.P.

(57) ABSTRACT

In one embodiment, a method of manufacturing a semiconductor device includes forming first patterns on a workpiece layer, and forming second patterns containing a first metal on side faces of the first patterns. The method further includes removing the first patterns after forming the second patterns, and forming third patterns on side faces of the second patterns by a chemical change of the first metal after removing the first patterns. The method further includes removing the second patterns after forming the third patterns, and processing the workpiece layer by using the third patterns as a mask after removing the second patterns.

16 Claims, 5 Drawing Sheets

US 9,640,481 B2

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/213,821 filed on Sep. 3, 2015, the entire contents of which are incorporated herein by reference.

FIELD

Embodiments described herein relate to a semiconductor device and a method of manufacturing the same.

BACKGROUND

Fine patterns of a semiconductor device are often formed by a sidewall transfer technique. In this case, the fine patterns having a desired dimension are formed by repeating formation, processing and slimming of plural layers. Therefore, many steps are required to form the fine patterns, which increase a manufacturing cost of the semiconductor device.

DETAILED DESCRIPTION

Embodiments will now be explained with reference to the accompanying drawings.

In one embodiment, a method of manufacturing a semiconductor device includes forming first patterns on a workpiece layer, and forming second patterns containing a first metal on side faces of the first patterns. The method further includes removing the first patterns after forming the second patterns, and forming third patterns on side faces of the second patterns by a chemical change of the first metal after removing the first patterns. The method further includes removing the second patterns after forming the third patterns, and processing the workpiece layer by using the third patterns as a mask after removing the second patterns.

First Embodiment

FIGS. 1A to 3C are cross-sectional views illustrating a method of manufacturing a semiconductor device of a first embodiment.

Figure 1A:
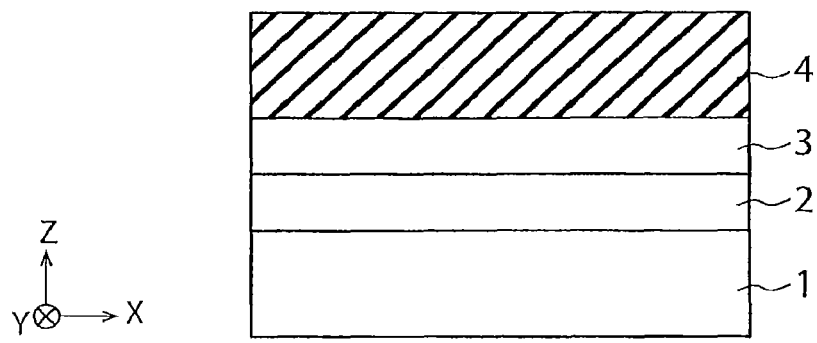
FIGS. 1A to 3C are cross-sectional views illustrating a method of manufacturing a semiconductor device of a first embodiment.

First, an underlying layer 2, a workpiece layer 3 and a core material layer 4 are formed on a substrate 1 (FIG. 1A).

An example of the substrate 1 is a semiconductor substrate such as a silicon substrate. FIG. 1A shows an X direction and a Y direction parallel to a surface of the substrate 1 and perpendicular to each other, and a Z direction perpendicular to the surface of the substrate 1. In the present specification, a +Z direction is treated as an upper direction, and a −Z direction is treated as a lower direction. The −Z direction in the present embodiment may or may not correspond to the gravity direction.

Examples of the underlying layer 2 and the workpiece layer are various conductive layers, semiconductor layers and insulating layers. The workpiece layer 3 may be formed on the substrate 1 via the underlying layer 2 as shown in FIG. 1A, or may be formed directly on the substrate 1. Although the workpiece layer 3 is a layer different from the substrate 1 in FIG. 1A, the substrate 1 itself may be used as the workpiece layer 3 instead. Examples of the core material layer 4 are a resist layer and a hard mask layer.

Figure 1B:
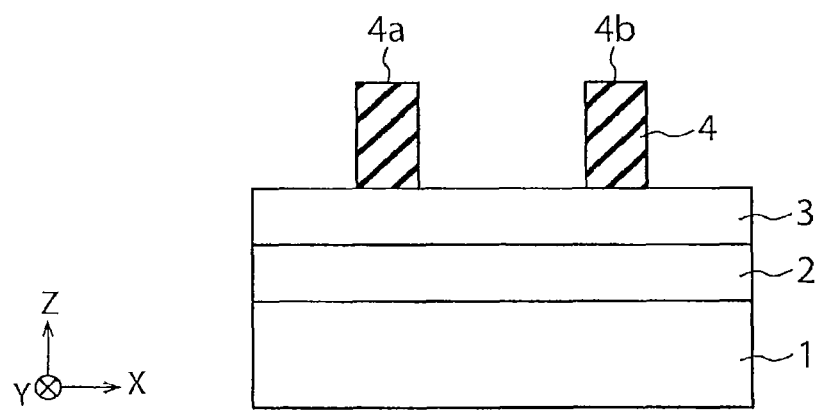

The core material layer 4 is then processed into core material patterns 4a and 4b by etching (FIG. 1B). The core material patterns 4a and 4b are an example of first patterns.

Figure 1C:
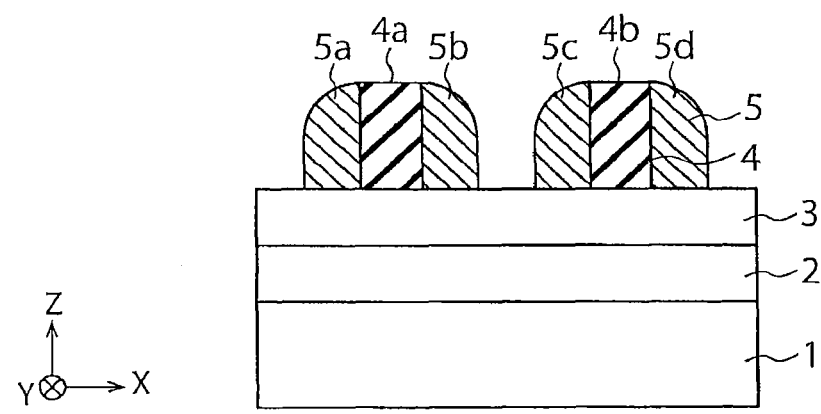

A metal layer 5 is then formed on the entire surface of the substrate 1 and is processed by etching (FIG. 1C). As a result, sidewall patterns 5a to 5d made of the metal layer 5 are formed on side faces of the core material patterns 4a and 4b. The sidewall patterns 5a to 5d are an example of second patterns. A metal contained in the metal layer 5 is, for example, tungsten (W), aluminum (Al) or copper (Cu). The metal contained in the metal layer 5 is an example of a first metal. The metal layer 5 in the present embodiment is an elemental metal layer such as a W layer, an Al layer or a Cu layer.

Figure 2A:
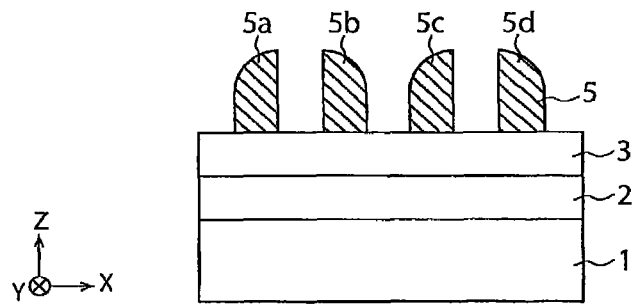

After the sidewall patterns 5a to 5d is formed, the core material patterns 4a and 4b are removed (FIG. 2A).

Figure 2B:
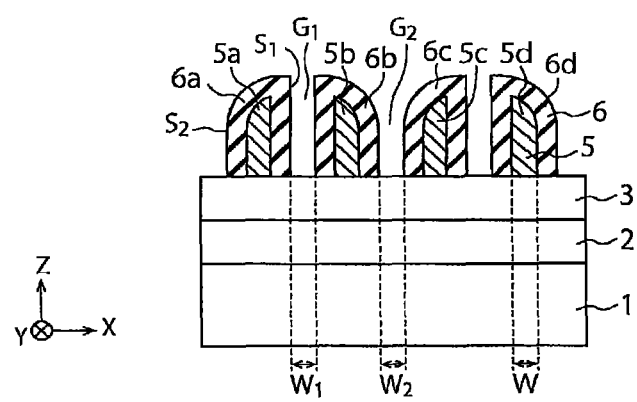

After the core material patterns 4a and 4b are removed, the metal in the metal layer 5 is oxidized (FIG. 2B). As a result, oxide film patterns 6a to 6d made of a metal oxide film 6 are formed on side faces and upper faces of the sidewall patterns 5a to 5d. The oxidation of the metal in the metal layer 5 is an example of a chemical change of the first metal. The oxide film patterns 6a to 6d are examples of third patterns. In the present embodiment, the metal layer 5 is a tungsten layer, and the metal oxide film 6 is a tungsten oxide film.

The metal in the metal layer 5 is oxidized by ashing with an oxygen ($O_2$) gas. This makes it possible to form the metal oxide film 6 having a sufficient thickness. The thickness of the metal oxide film 6 can be controlled by adjusting the amount of oxidation of the metal layer 5. The ashing in the present embodiment may be performed with the oxygen gas and a nitrogen ($N_2$) gas. The nitrogen gas is used to raise an oxidation rate of the metal layer 5. The ashing in the present embodiment is performed in a dry etching apparatus, for example. In this case, the etching in FIG. 1C, the removal of the core material in FIG. 2A, and the ashing in FIG. 2B may be performed in the same dry etching apparatus.

FIG. 2B illustrates a first side face $S_1$ of each oxide film pattern 6a to 6d and a second side face $S_2$ of each oxide film pattern 6a to 6d, the second side face $S_2$ being more inclined than the first side face $S_1$. In the present embodiment, the oxide film patterns 6a to 6d are formed to form first gaps $G_1$ between the first side faces $S_1$ of the oxide film patterns 6a to 6d and to form second gaps $G_2$ between the second side faces $S_2$ of the oxide film patterns 6a to 6d.

FIG. 2B also illustrates a width W of bottom faces of the sidewall patterns 5a to 5d, a width $W_1$ of bottom faces of the first gaps $G_1$, and a width $W_2$ of bottom faces of the second gaps $G_2$. In the present embodiment, the width $W_1$ and the width $W_2$ are set to values close to a value of the width W, and are specifically set to be 0.5 to 1.5 times of the width W ($0.5W \leq W_1 \leq 1.5W$, $0.5W \leq W_2 \leq 1.5W$).

Figure 2C:
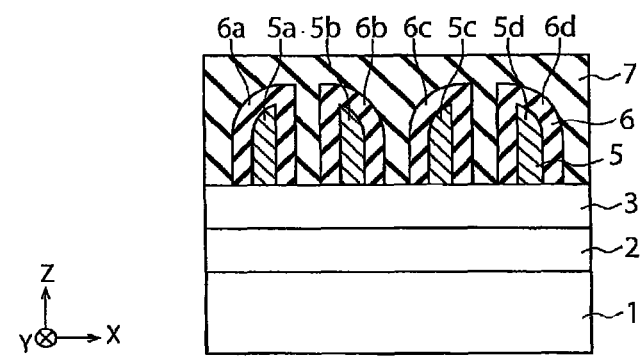

Next, a sacrificial film 7 is formed on the entire surface of the substrate 1 (FIG. 2C). As a result, the sidewall patterns 5a to 5d and the oxide film patterns 6a to 6d are covered with the sacrificial film 7. The sacrificial film 7 is an example of a first film. The sacrificial film 7 is a silicon oxide film or a silicon nitride film, for example. The sacrificial film 7 may be a polysilicon layer or a metal layer.

Figure 3A:
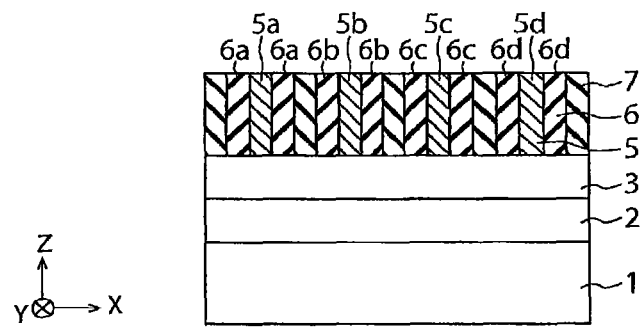

A surface of the sacrificial film 7 is then planarized by etch back (FIG. 3A). As a result, the oxide film patterns 6a to 6d are exposed from the sacrificial film 7. Furthermore, the sidewall patterns 5a to 5d are exposed from the oxide film patterns 6a to 6d. At this time, since the oxide film pattern 6a is removed from the upper face of the sidewall pattern 5a, the oxide film pattern 6a provided on the sidewall pattern 5a is divided into two. The same is true of the other oxide film patterns 6b to 6d.

Figure 3B:
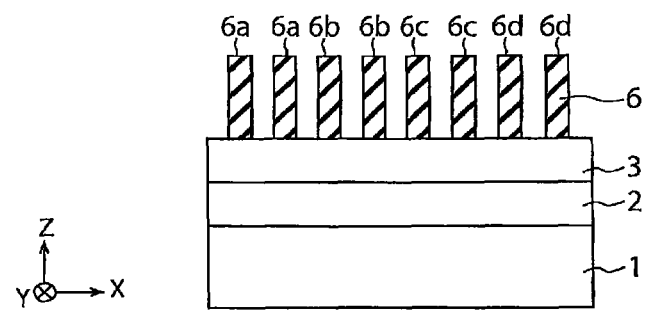

The exposed sidewall patterns 5a to 5d and the sacrificial film 7 are then removed (FIG. 3B). Since the widths $W_1$ and $W_2$ of the present embodiment is set to the values close to the value of the width W (refer to FIG. 2B), distances between the oxide film patterns 6a to 6d are close values to each other.

Figure 3C:
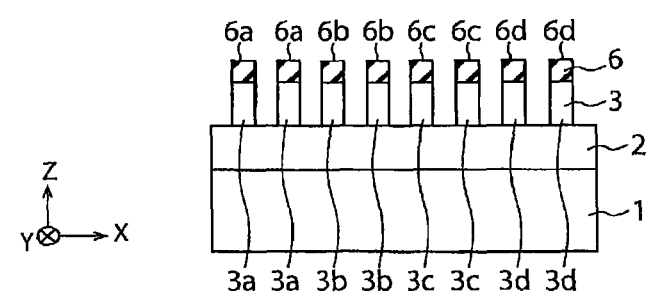

Next, the workpiece layer 3 is processed by etching using the oxide film patterns 6a to 6d as a mask (FIG. 3C). As a result, the oxide film patterns 6a to 6d are transferred to the workpiece layer 3, and desired fine patterns 3a to 3d are formed of the workpiece layer 3.

Thereafter, various interconnect layers, plug layers and inter layer dielectrics are formed on the substrate 1. In this manner, the semiconductor device of the present embodiment is manufactured.

As described above, in the present embodiment, the sidewall patterns 5a to 5d are formed of the metal layer 5, the oxide film patterns 6a to 6d are formed by oxidation of the metal layer 5, and the oxide film patterns 6a to 6d are used as a mask to process the workpiece layer 3.

Accordingly, the present embodiment makes it possible to form the fine patterns 3a to 3d only with a single layer (metal oxide film 6) by a sidewall transfer technique without forming core material patterns and sidewall patterns plural times. The reason is that the process of forming the core material patterns plural times and the process of forming the sidewall patterns plural times can be replaced with the process of forming the oxide film patterns 6a to 6d. In the present embodiment, the fine patterns 3a to 3d can be formed while the number of times of forming the core material patterns 4a and 4b is decreased to one, and the number of times of forming the sidewall patterns 5a to 5d is decreased to one.

As described above, the present embodiment makes it possible to form the desired patterns 3a to 3d by the sidewall transfer technique easily.

Second Embodiment

Figure 4A:
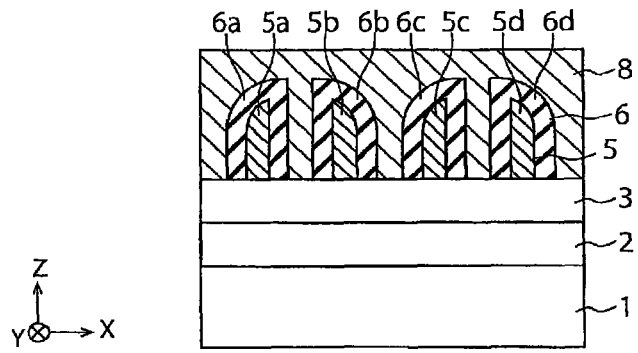
FIGS. 4A to 5 are cross-sectional views illustrating a method of manufacturing a semiconductor device of a second embodiment.
Figure 4B:
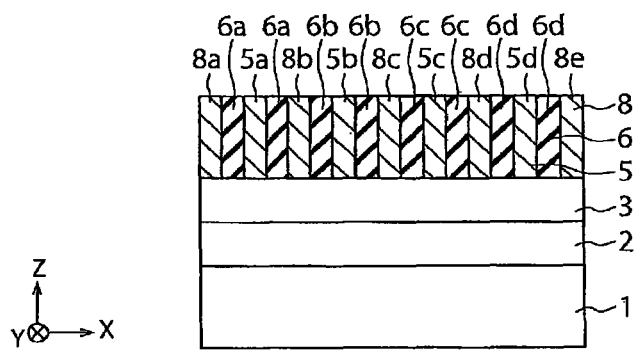
Figure 4C:
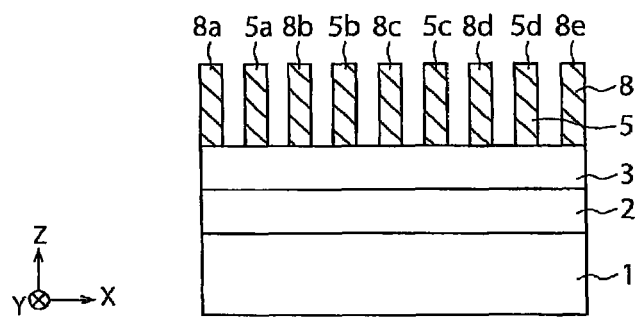
Figure 5:
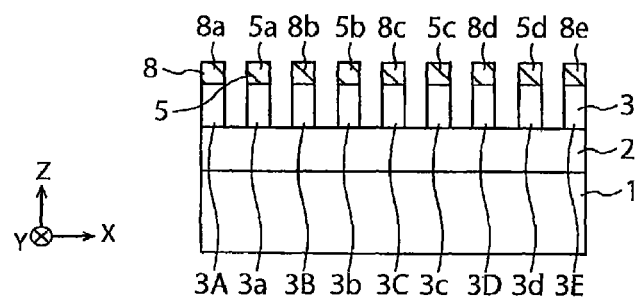

FIGS. 4A to 5 are cross-sectional views illustrating a method of manufacturing a semiconductor device of a second embodiment.

First, the steps in FIGS. 1A to 2B are performed.

Next, a metal layer 8 is formed on the entire surface of the substrate 1 (FIG. 4A). As a result, the sidewall patterns 5a to 5d and the oxide film patterns 6a to 6d are covered with the metal layer 8. The metal layer 8 is an example of the first film.

A metal contained in the metal layer 8 is, for example, tungsten (W), aluminum (Al) or copper (Cu). The metal contained in the metal layer 8 is an example of a second metal. The metal layer 8 in the present embodiment is an elemental metal layer such as a W layer, an Al layer or a Cu layer. The metal layer 8 may contain a metal same as or different from the metal in the metal layer 5. For example, the metal layers 5 and 8 may both be W layers or may respectively be a W layer and an Al layer.

A surface of the metal layer 8 is then planarized by etch back (FIG. 4B). As a result, the oxide film patterns 6a to 6d are exposed from the metal layer 8, and the sidewall patterns 5a to 5d are exposed from the oxide film patterns 6a to 6d. At this time, since the oxide film pattern 6a is removed from the upper face of the sidewall pattern 5a, the oxide film pattern 6a provided on the sidewall pattern 5a is divided into two. The same is true of the other oxide film patterns 6b to 6d. Furthermore, buried patterns 8a to 8e formed of the metal layer 8 are formed between the oxide film patterns 6a to 6d. The buried patterns 8a to 8e are examples of fourth patterns.

The exposed oxide film patterns 6a to 6d are then removed (FIG. 4C). Since the widths $W_1$ and $W_2$ of the present embodiment is set the values close to the value of the width W (refer to FIG. 2B), distances between the sidewall patterns 5a to 5d and the buried patterns 8a to 8e are close values to each other.

Next, the workpiece layer 3 is processed by etching using the sidewall patterns 5a to 5d and the buried patterns 8a to 8e as a mask (FIG. 5). As a result, the sidewall patterns 5a to 5d and the buried patterns 8a to 8e are transferred to the workpiece layer 3, and desired fine patterns 3a to 3d and 3A to 3E are formed of the workpiece layer 3. The fine patterns 3a to 3d correspond to the sidewall patterns 5a to 5d, and the fine patterns 3A to 3E correspond to the buried patterns 8a to 8e.

Thereafter, various interconnect layers, plug layers and inter layer dielectrics are formed on the substrate 1. In this manner, the semiconductor device of the present embodiment is manufactured.

As described above, in the present embodiment, the sidewall patterns 5a to 5d are formed of the metal layer 5, the oxide film patterns 6a to 6d are formed by oxidation of the metal layer 5, the buried patterns 8a to 8e are formed between the oxide film patterns 6a to 6d, and the sidewall patterns 5a to 5d and the buried patterns 8a to 8e are used as a mask to process the workpiece layer 3.

Similarly to the first embodiment, the present embodiment makes it possible to form the desired patterns 3a to 3d and 3A to 3E by the sidewall transfer technique easily. Also, the present embodiment makes it possible, by using the metal layers 5 and 8 as a mask, to improve etching resistance of the mask and to perform etching of the workpiece layer 3 easily.

Modification of Second Embodiment

Figure 6:
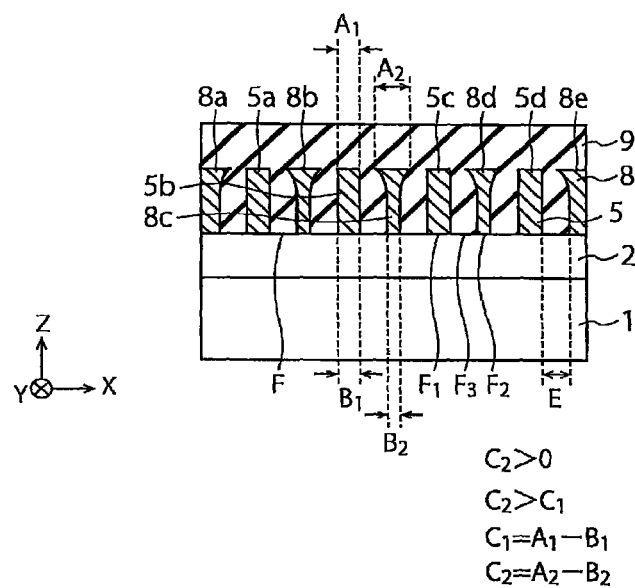
FIG. 6 is a cross-sectional view illustrating a method of manufacturing a semiconductor device of a modification of the second embodiment.

FIG. 6 is a cross-sectional view illustrating a method of manufacturing a semiconductor device of a modification of the second embodiment.

In the present modification, the sidewall patterns 5a to 5d and the buried patterns 8a to 8e are used as interconnects, not as a mask. Accordingly, after the step in FIG. 4C, the sidewall patterns 5a to 5d and the buried patterns 8a to 8e are covered with an inter layer dielectric 9 (FIG. 6). Examples of the inter layer dielectric 9 is a silicon oxide film and a silicon nitride film. Thereafter, contact plugs that reach the sidewall patterns 5a to 5d and the buried patterns 8a to 8e are formed in the inter layer dielectric 9.

The sidewall patterns 5a to 5d and the buried patterns 8a to 8e in the present modification are formed alternately on the underlying layer 2. The sidewall patterns 5a to 5d are an example of first interconnect patterns. The buried patterns 8a to 8e are an example of second interconnect patterns.

FIG. 6 illustrates widths $A_1$ and $B_1$ of an upper face and a lower face of each sidewall pattern 5a to 5d, and widths $A_2$ and $B_2$ of an upper face and a lower face of each buried pattern 8a to 8e. FIG. 6 illustrates shapes of the sidewall patterns 5a to 5d and the buried patterns 8a to 8e further in detail than FIG. 4C. Specifically, the width $A_1$ is approximately equal to the width $B_1$, and the width $A_2$ is longer than the width $B_2$. This results from shapes of the oxide film patterns 6a to 6d.

Accordingly, in the present modification, a second value $C_2$ derived by subtracting the width $B_2$ from the width $A_2$ of the buried patterns 8a to 8e is a positive value and is higher than a first value $C_1$ derived by subtracting the width $B_1$ from the width $A_1$ of the sidewall patterns 5a to 5d. That is, $C_2>0$ and $C_2>C_1$ are established. It is noted that the first value $C_1$ may be a positive value, a negative value or zero.

A sign F represents an upper face of the underlying layer 2. The sidewall patterns 5a to 5d and the buried patterns 8a to 8e contact the upper face F of the underlying layer 2. The underlying layer 2 is an example of a first layer, and the upper face F is an example of a first upper face. In a case where the sidewall patterns 5a to 5d and the buried patterns 8a to 8e are formed directly on the substrate 1, an upper face of the substrate 1 is an example of the first upper face. The upper face F of the underlying layer 2 is classified into upper faces $F_1$ under the sidewall patterns 5a to 5d, upper faces $F_2$ under the buried patterns 8a to 8e, and upper faces $F_3$ between the sidewall patterns 5a to 5d and the buried patterns 8a to 8e. A sign E represents a width of the upper faces $F_3$.

The sidewall patterns 5a to 5d and the buried patterns 8a to 8e in the present modification are formed in the shapes in FIG. 6 by removing the oxide film patterns 6a to 6d by etching. At this time, since the sidewall patterns 5a to 5d and the buried patterns 8a to 8e are elemental metal layers and the oxide film patterns 6a to 6d are metal oxide films, it is easy to set high selectivity of this etching. For this reason, this etching can be performed while restricting denting of the upper face $F_3$.

Here, a difference between the upper faces $F_1$ and $F_3$ is expressed by $\Delta F_1$ ($\Delta F_1=|F_1-F_3|$), and a difference between the upper faces $F_2$ and $F_3$ is expressed by $\Delta F_2$ ($\Delta F_2=|F_2-F_3|$). In the present modification, since the denting of the upper face $F_3$ does not exist or is small, values of the differences $\Delta F_1$, and $\Delta F_2$ are low. For example, the values of the differences $\Delta F_1$ and $\Delta F_2$ in the present modification can be lower than 0.5 times of the width E of the upper faces $F_3$ ($\Delta F_1<0.5E$, $\Delta F_2<0.5E$). In this case, a depth of the dents of the upper faces $F_3$ is smaller than a radius of a circle whose diameter is the width E of the upper faces $F_3$.

In a case where the upper faces $F_3$ are dented, the thickness of the underlying layer 2 needs to be large in consideration of the dents. However, according to the present modification, since the denting of the upper faces $F_3$ can be restricted, the thickness of the underlying layer 2 can be small.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming first patterns on a workpiece layer;
    forming second patterns containing a first metal on side faces of the first patterns;
    removing the first patterns after forming the second patterns;
    forming third patterns on side faces of the second patterns by a chemical change of the first metal after removing the first patterns;
    removing the second patterns after forming the third patterns; and
    processing the workpiece layer by using the third patterns as a mask after removing the second patterns.

2. The method of claim 1, wherein the chemical change of the first metal is oxidation of the first metal.

3. The method of claim 2, wherein the first metal is oxidized by ashing with an oxygen gas.

4. The method of claim 3, wherein the ashing of the first metal is performed with the oxygen gas and a nitrogen gas.

5. The method of claim 1, wherein the second patterns are formed of an elemental metal layer containing the first metal.

6. The method of claim 1, wherein the third patterns are formed to form a first gap between first side faces of the third patterns and to form a second gap between second side faces of the third patterns, the second faces being more inclined than the first side faces, a width of a bottom face of the first gap and a width of a bottom face of the second gap being 0.5 to 1.5 times of a width of bottom faces of the second patterns.

7. The method of claim 1, further comprising:
    forming a first film on the third patterns after forming the third patterns,
    planarizing a surface of the first film to expose the second patterns from the third patterns, and
    removing the exposed second patterns and the first film.

8. A method of manufacturing a semiconductor device, comprising:
    forming first patterns on a workpiece layer;
    forming second patterns containing a first metal on side faces of the first patterns;
    removing the first patterns after forming the second patterns;
    forming third patterns on side faces of the second patterns by a chemical change of the first metal after removing the first patterns;
    forming fourth patterns containing a second metal between the third patterns;
    removing the third patterns after forming the fourth patterns; and
    processing the workpiece layer by using the second and fourth patterns as a mask after removing the third patterns.

9. The method of claim 8, wherein the chemical change of the first metal is oxidation of the first metal.

10. The method of claim 9, wherein the first metal is oxidized by ashing with an oxygen gas.

11. The method of claim 10, wherein the ashing of the first metal is performed with the oxygen gas and a nitrogen gas.

12. The method of claim 8, wherein the second patterns are formed of an elemental metal layer containing the first metal.

13. The method of claim 8, wherein the second metal is a same metal as the first metal.

14. The method of claim 8, wherein the second metal is a different metal from the first metal.

15. The method of claim 8, wherein the third patterns are formed to form a first gap between first side faces of the third patterns and to form a second gap between second side faces of the third patterns, the second faces being more inclined than the first side faces, a width of a bottom face of the first gap and a width of a bottom face of the second gap is 0.5 to 1.5 times of a width of bottom faces of the second patterns.

16. The method of claim 8, further comprising:
   forming a first film on the third patterns after forming the third patterns, and
   planarizing a surface of the first film to expose the second patterns from the third patterns and to form the fourth patterns of the first film.

* * * * *